United States Patent
Bonke

(10) Patent No.: US 8,375,274 B1
(45) Date of Patent: Feb. 12, 2013

(54) DISK DRIVE RECOVERING MULTIPLE CODEWORDS IN DATA SECTORS USING PROGRESSIVELY HIGHER ORDER PARITY CODEWORDS

(75) Inventor: Carl E. Bonke, Coto De Caza, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 991 days.

(21) Appl. No.: 12/408,989

(22) Filed: Mar. 23, 2009

(51) Int. Cl.
*H03M 13/00* (2006.01)

(52) U.S. Cl. .................................. 714/770; 714/758

(58) Field of Classification Search .................. 714/770, 714/758, 746, 704
See application file for complete search history.

(56) References Cited

U.S. PATENT DOCUMENTS

| | | | |
|---|---|---|---|
| 4,556,977 A * | 12/1985 | Olderdissen et al. | 714/782 |
| 5,751,733 A | 5/1998 | Glover | |
| 5,844,919 A | 12/1998 | Glover et al. | |
| 6,405,342 B1 * | 6/2002 | Lee | 714/792 |
| 6,604,220 B1 * | 8/2003 | Lee | 714/769 |
| 6,883,131 B2 | 4/2005 | Acton | |
| 7,171,594 B2 * | 1/2007 | Wyatt et al. | 714/704 |
| 7,340,665 B2 * | 3/2008 | Tsang | 714/766 |
| 2007/0011563 A1 * | 1/2007 | Tsang | 714/758 |

* cited by examiner

*Primary Examiner* — Phung Chung

(57) ABSTRACT

A disk drive is disclosed comprising a disk and a head actuated over the disk. The disk comprises a plurality of tracks, wherein each track comprises a plurality of data sectors including a parity sector, the parity sector comprising at least a P0 parity codeword and a P1 parity codeword. A plurality of data sectors are read from the disk (including the parity sector) to generate a plurality of data codewords CW0-CWn. The data sectors are decoded using an error correction code (ECC) decoder. When a single data codeword in CW0-CWn is unrecoverable using the ECC decoder, the single data codeword is recovered using the P0 parity codeword. When two data codewords in CW0-CWn are unrecoverable using the ECC decoder, the two data codewords are recovered using the P0 and P1 parity codewords.

18 Claims, 7 Drawing Sheets

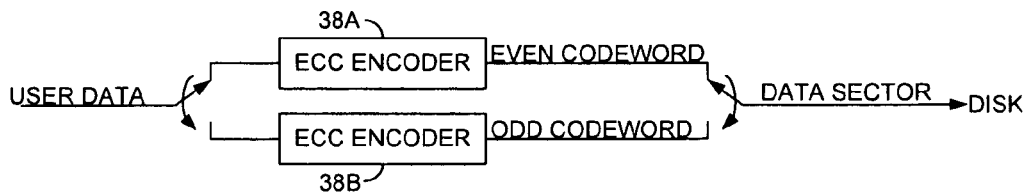
FIG. 2A
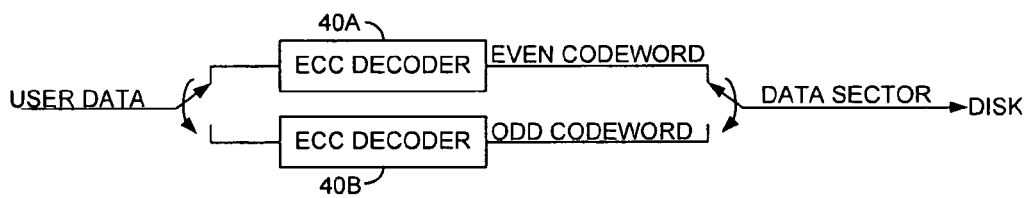
FIG. 2B
| SECTOR | INTERLEAVE | | |
|---|---|---|---|
| 0 | DATA | ECC | CW0 |
|   | DATA | ECC | CW1 |
| 1 | DATA | ECC | CW2 |
|   | DATA | ECC | CW3 |
| 2 | DATA | ECC | CW4 |
|   | DATA | ECC | CW5 |
| 3 | DATA | ECC | CW6 |
|   | DATA | ECC | CW7 |
| PARITY | DATA | ECC | $P0 = CW0 \oplus CW1 \oplus ... \oplus CW7$ |
|   | DATA | ECC | $P1 = \alpha^0 \otimes CW0 \oplus \alpha^1 \otimes CW1 \oplus ... \alpha^7 \otimes CW7$ |
FIG. 3

$$CW1 \oplus CW3 = P0 \oplus CW0 \oplus CW2 \oplus \ldots \oplus CW7$$

$$\alpha^1 \otimes CW1 \oplus \alpha^3 \otimes CW3 = P1 \oplus \alpha^0 \otimes CW0 \oplus \alpha^2 \otimes CW2 \oplus \ldots \alpha^7 \otimes CW7$$

FIG. 4A $$\begin{bmatrix} 1 & 1 \\ \alpha^1 & \alpha^3 \end{bmatrix} \otimes \begin{bmatrix} CW1 \\ CW3 \end{bmatrix} = \begin{bmatrix} P0^* \\ P1^* \end{bmatrix}$$

FIG. 4B $$\begin{bmatrix} CW1 \\ CW3 \end{bmatrix} = \begin{bmatrix} 1 & 1 \\ \alpha^1 & \alpha^3 \end{bmatrix}^{-1} \otimes \begin{bmatrix} P0^* \\ P1^* \end{bmatrix} = \frac{1}{\alpha^1 \oplus \alpha^3} \otimes \begin{bmatrix} \alpha^3 & 1 \\ \alpha^1 & 1 \end{bmatrix} \otimes \begin{bmatrix} P0^* \\ P1^* \end{bmatrix}$$

FIG. 4C $$Pr = \sum_{j=0}^{n-1} \alpha^{r \otimes j} \otimes CWj$$

FIG. 5

| 3-WAY INTERLEAVE | |
|---|---|
| SECTOR | INTERLEAVE |
| 0 | 0 |
| | 1 |
| | 2 |
| 1 | 0 |
| | 1 |
| | 2 |
| 2 | 0 |
| | 1 |
| | 2 |
| 3 | 0 |
| | 1 |
| | 2 |
| PARITY | P0 |
| | P1 |
| | P2 |

FIG. 6A

| 4-WAY INTERLEAVE | |
|---|---|
| SECTOR | INTERLEAVE |
| 0 | 0 1 |
| | 2 3 |
| 1 | 0 1 |
| | 2 3 |
| 2 | 0 1 |
| | 2 3 |
| 3 | 0 1 |
| | 2 3 |
| PARITY | P0 P1 |
| | P0 P1 |

FIG. 6B

| 4-WAY INTERLEAVE | |
|---|---|
| SECTOR | INTERLEAVE |
| 0 | 0 |
| | 1 |
| | 2 |
| | 3 |
| 1 | 0 |
| | 1 |
| | 2 |
| | 3 |
| 2 | 0 |
| | 1 |
| | 2 |
| | 3 |
| 3 | 0 |
| | 1 |
| | 2 |
| | 3 |
| PARITY | P0 |
| | P1 |
| | P2 |
| | P3 |

FIG. 6C

DISK DRIVE RECOVERING MULTIPLE CODEWORDS IN DATA SECTORS USING PROGRESSIVELY HIGHER ORDER PARITY CODEWORDS

BACKGROUND

Description of the Related Art

Disk drives comprise a disk and a head connected to a distal end of an actuator arm which is rotated about a pivot by a voice coil motor (VCM) to position the head radially over the disk. The disk comprises a plurality of radially spaced, concentric tracks for recording user data sectors and embedded servo sectors. The embedded servo sectors comprise head positioning information (e.g., a track address) which is read by the head and processed by a servo controller to control the velocity of the actuator arm as it seeks from track to track.

The data sectors are typically encoded using an error correction code (ECC), such as a Reed-Solomon ECC. In addition, each data sector may be interleaved (e.g., even and odd interleave ECC codewords) which may increase the correction power for certain types of media defects. The prior art has also employed a parity sector (e.g., a track level parity sector) for recovering a data sector unrecoverable at the sector level (using the ECC). An unrecoverable data sector is recovered by combining the recovered data sectors with the parity sector.

U.S. Pat. No. 5,751,733 applies the parity sector technique to an interleaved system, wherein a parity codeword is generated for each interleave data codeword across multiple data sectors. For example, if the disk drive employs three interleaves in each data sector, the '733 patent is capable of recovering up to three codewords as long as each unrecoverable codeword occurs in a unique interleave, but the '733 patent is unable to recover two or more codewords in a single interleave.

BRIEF DESCRIPTION OF THE DRAWINGS

FIGS. 2A and 2B show an embodiment of the present invention wherein each data sector comprises two interleaved ECC codewords (generated over the even and odd symbols of the data sector).

FIG. 3 shows equations for generating the P0 and P1 parity codewords, wherein each data codeword CW0-CW7 comprises an interleaved ECC codeword according to an embodiment of the present invention.

FIGS. 4A-4C show equations for recovering two data codewords CW1 and CW3 using the P0 and P1 parity sectors, wherein both data codewords are in the same interleave.

FIG. 5 shows an equation for generating n parity codewords capable of recovering n data codewords.

FIG. 6A shows an embodiment of the present invention wherein each data sector comprises three interleaved ECC codewords and the parity sector comprises three parity codewords.

FIG. 6B shows an embodiment of the present invention wherein each data sector comprises four interleaved ECC codewords and the parity sector comprises two sets of P0 and P1 parity codewords.

FIG. 6C shows an embodiment of the present invention wherein each data sector comprises four interleaved ECC codewords and the parity sector comprises four parity codewords.

DETAILED DESCRIPTION OF EMBODIMENTS OF THE INVENTION

Figure 1A:
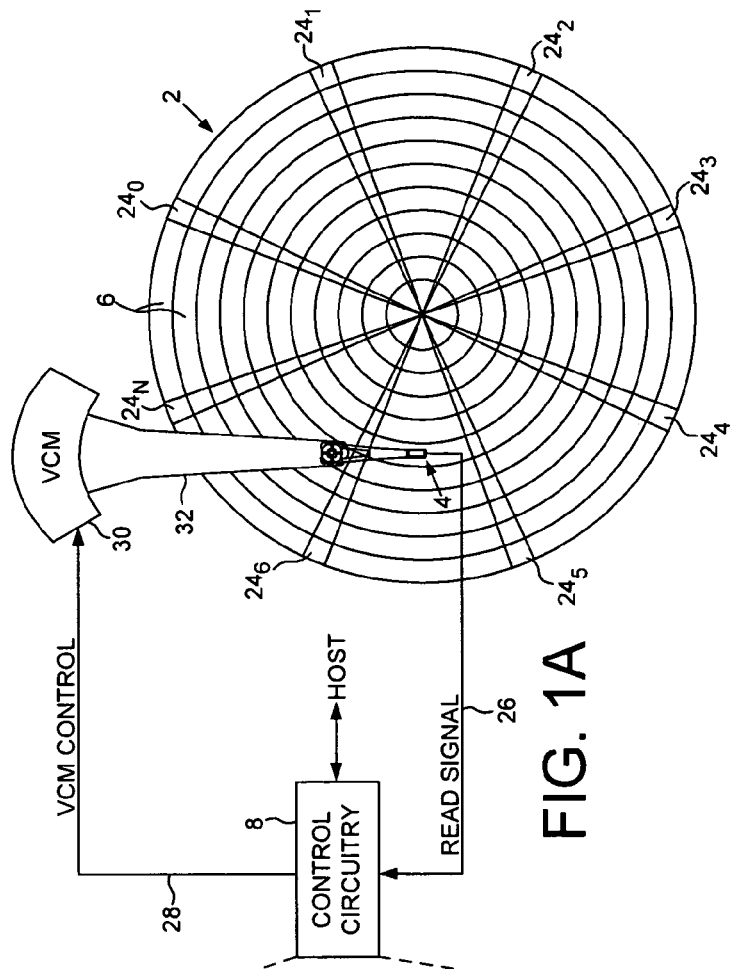
FIG. 1A shows a disk drive according to an embodiment of the present invention comprising a disk, a head actuated over the disk, and control circuitry.
Figure 1B:
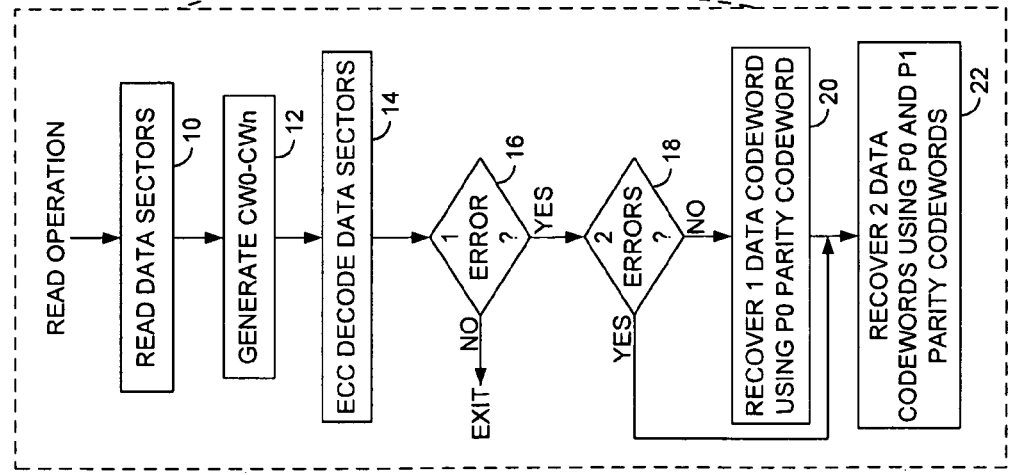
FIG. 1B is a flow diagram according to an embodiment of the present invention for recovering a single data codeword using a P0 parity codeword, and for recovering two data codewords using a P0 and a P1 parity codeword.

FIG. 1A shows a disk drive according to an embodiment of the present invention comprising a disk 2 and a head 4 actuated over the disk 2. The disk 2 comprises a plurality of tracks 6, wherein each track comprises a plurality of data sectors including a parity sector, the parity sector comprising at least a P0 parity codeword and a P1 parity codeword. FIG. 1B is a flow diagram executed by control circuitry 8 wherein a plurality of data sectors (including the parity sector) are read from the disk (step 10) to generate a plurality of data codewords CW0-CWn (step 12). The data sectors are decoded using an error correction code (ECC) decoder (step 14). When a single data codeword in CW0-CWn is unrecoverable using the ECC decoder (step 16), the single data codeword is recovered using the P0 parity codeword (step 20). When two data codewords in CW0-CWn are unrecoverable using the ECC decoder (step 18), the two data codewords are recovered using the P0 and P1 parity codewords (step 22).

In the embodiment of FIG. 1A, the disk 2 comprises a plurality of servo sectors $24_0$-$24_N$ that define the plurality of tracks 6. The control circuitry 8 processes the read signal 26 to demodulate the servo sectors $24_0$-$24_N$ into a position error signal (PES). The PES is filtered with a suitable compensation filter to generate a control signal 28 applied to a voice coil motor (VCM) 30 which rotates an actuator arm 32 about a pivot in order to position the head 4 radially over the disk 2 in a direction that reduces the PES. The servo sectors $24_0$-$24_N$ may comprise any suitable position information, such as a track address for coarse positioning and servo bursts for fine positioning.

Figure 1C:
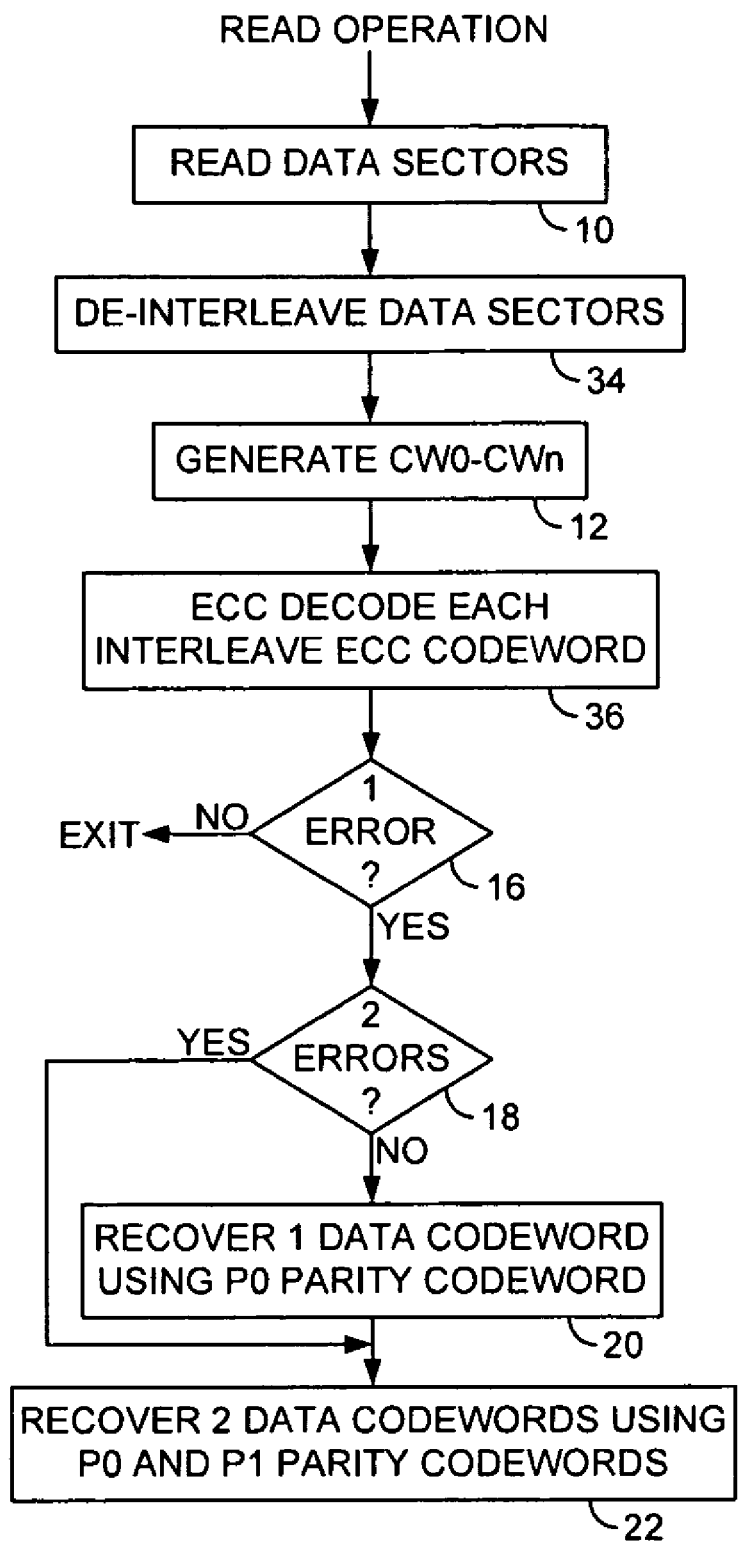
FIG. 1C is a flow diagram according to an embodiment of the present invention wherein each data sector comprises a plurality of interleaved ECC codewords.

FIG. 1C is a flow diagram according to an embodiment of the present invention which extends on the flow diagram of FIG. 1B, wherein each data sector comprises a plurality of interleaved ECC codewords. The control circuitry de-interleaves the data sectors into the ECC codewords including to de-interleave the parity sector into the parity codewords (step 34). The ECC codewords (including the parity codewords) are decoded using the ECC decoder (step 36), wherein unrecoverable codewords at the ECC level are recovered using the parity codewords.

FIG. 2A shows an embodiment of the present invention wherein each data sector comprises two interleaved ECC codewords which are generated by encoding 38A the even data symbols into a first ECC codeword, and encoding 38B the odd data symbols into a second ECC codeword. The symbols of the ECC codewords are then written to a data sector by interleaving the symbols of each ECC codeword. During a read operation shown in FIG. 2B, the interleaved ECC codewords are de-interleaved and decoded by decoding the even symbols 40A and by decoding the odd symbols 40B.

FIG. 3 shows an embodiment of the present invention wherein each data sector comprises two interleaved ECC codewords, wherein each interleaved ECC codeword represents a data codeword CW0-CW7 that are encoded to generate the parity codewords P0 and P1 stored in the parity sector. In the embodiment shown in FIG. 3, the parity codewords are generated over four data sectors (eight data codewords CW0-CW7); however, the parity codewords may be generated over any suitable number of data sectors. In the embodiment of FIG. 3, the P0 parity codeword is generated according to:

$$P0 = CW0 \oplus CW1 \oplus \ldots CWn$$

and the P1 parity codeword is generated according to:

$$P1 = \alpha^0 \otimes CW0 \oplus \alpha^1 \otimes CW1 \oplus \ldots \text{an } 0 \text{ } CWn$$

In one embodiment, only the data part of a data codeword is used to generate the data portion of the parity codeword (the ECC redundancy is ignored). After generating the data portion of the parity codeword, the parity codeword is encoded to generate ECC redundancy symbols appended to the parity codeword. In this manner, when reading the parity sector, the parity codewords are decoded using the ECC decoder in order to detect and correct errors in the parity codewords. In an alternative embodiment, the ECC redundancy symbols appended to the parity codewords are generated by encoding the ECC redundancy symbols in each of the data codewords in the same manner as the data symbols are encoded using the parity encoders.

In the embodiment of FIG. 3, any two of the data codewords may be recovered using the parity codewords P0 and P1, including two data codewords that are in the same interleave. FIG. 4A shows an example where data codewords CW1 and CW3 (which are both in the odd interleave) are unrecoverable using the ECC decoder. With the two equations shown in FIG. 4A, it is possible to recover the two unknowns (CW1 and CW3) by rearranging the equations as shown in FIGS. 4B and 4C. A similar solution can be derived for any two of the data codewords that are unrecoverable using the ECC decoder.

The example of FIGS. 4A-4C can be extended to cover any number of parity codewords so as to recover any number of data codewords unrecoverable using the ECC decoder. FIG. 5 shows a general equation for generating higher order parity codewords which can be manipulated similar to FIGS. 4A-4C in order to recover any number of data codewords.

FIG. 6A shows an embodiment wherein each data sector comprises three interleaved ECC codewords, and the parity sector comprises three parity codewords P0, P1, and P2 generated according to the equation shown in FIG. 5. In this embodiment, any three of the data codewords (interleaved ECC codewords) may be recovered using the parity codewords.

FIG. 6B shows an embodiment wherein each data sector comprises four interleaved ECC codewords, and the parity sector comprises two sets of P0 and P1 parity codewords. The first set of P0 and P1 parity codewords are generated over the even interleaves (0 and 2), and the second set of P0 and P1 parity codewords are generated over the odd interleaves (1 and 3). This embodiment can recover any two data codewords in the even interleaves, and recover any two data codewords in the odd interleaves.

FIG. 6C shows an embodiment wherein each data sector comprises four interleaved ECC codewords, and the parity sector comprises four parity codewords P0, P1, P2 and P3 generated using the equation shown in FIG. 5. This embodiment can recover any four data codewords (in any interleave) that are unrecoverable using the ECC decoder.

Figures 7A, 7B:
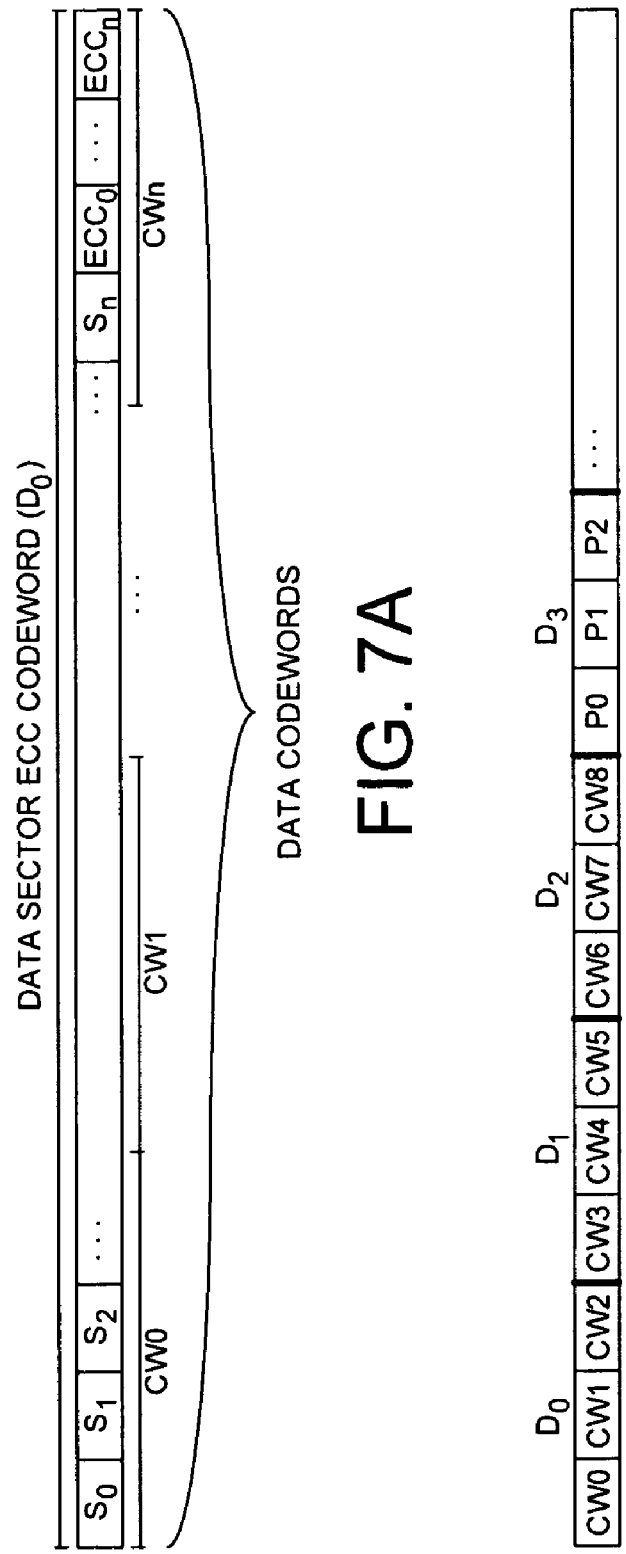
FIG. 7A shows an embodiment of the present invention wherein a data sector comprises an ECC codeword which is segmented into a plurality of data codewords.
FIG. 7B shows an embodiment of the present invention wherein each data sector comprises an ECC codeword segmented into three data codewords, and the parity sector comprises three parity codewords generated over all of the data codewords of multiple data sectors.

Any suitable configuration of data codewords within a data sector may be employed in the embodiments of the present invention. In the embodiments described above, a data codeword comprises a full ECC codeword (e.g., one of multiple interleaved ECC codewords recorded in the same data sector, or one of multiple sequential ECC codewords recorded in the same data sector, etc.). However, in other embodiments the data codewords may comprise only part of an ECC codeword within a data sector. FIG. 7A shows an embodiment wherein the symbols of a single ECC codeword within a data sector D0 is divided into multiple data codewords CW0-CWn. That is, each data codeword CWi represents a segment of a full ECC codeword. FIG. 7B shows an embodiment wherein an ECC codeword of each data sector is segmented into three data codewords. The data codewords from a number of data sectors (CW0-CW8 in the example of FIG. 7B) are then combined to generate three parity codewords P0, P1 and P2 stored in the parity sector. In one embodiment, if any one of the ECC codewords is unrecoverable using the ECC decoder, the ECC codeword (three data codewords) can be recovered using the parity codewords. In another embodiment described below with reference to FIG. 8, the parity codewords may be used to recover up to three unrecoverable ECC codewords depending on the number of data codewords in error in each ECC codeword. In the embodiment of FIG. 7B, each data sector comprises a single ECC codeword; however, this can be extended to cover an embodiment where each data sector comprises a plurality of interleaved or sequential ECC codewords.

Figure 8:
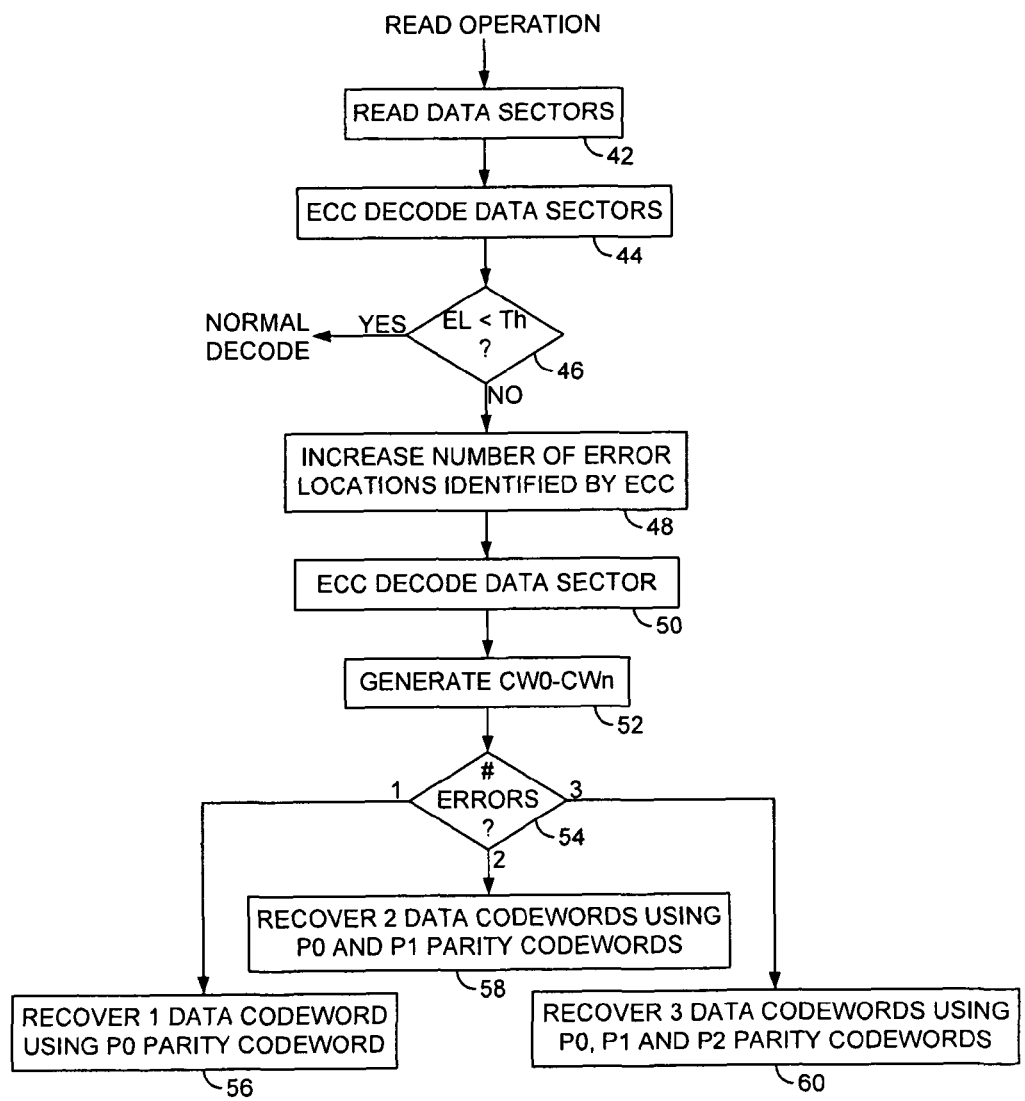
FIG. 8 is a flow diagram according to an embodiment of the present invention wherein when a data sector is unrecoverable using the ECC decoder, the ECC algorithm is modified to generate more error locations which are used to recover unrecoverable data codewords using the parity codewords.

FIG. 8 is a flow diagram according to an embodiment of the present invention wherein the ECC decoding is modified in order to increase the number of error locations detected. If a linear ECC code has a Hamming weight of 2 t+1, then the code can correct up to t errors and detect up to 2 t error locations. Typically the ECC decoder is configured to correct up to t errors, and therefore also configured to detect up to t error locations. In the embodiment of FIG. 8, if an ECC codeword is unrecoverable using the ECC decoder, the ECC decoding algorithm is modified so that up to 2 t error locations can be identified. This may enhance the recoverability of the data codewords using the parity codewords. Referring to the embodiment of FIG. 7B, by increasing the number of error locations identified from t to 2 t, it may be possible to identify which data codewords CW0, CW1, or CW2 within each ECC codeword are in error. For example, if all of the error locations fall within one of the data codewords in each of three ECC codewords, then all three ECC codewords may be recoverable using the parity codewords.

Referring again to FIG. 8, a number of data sectors are read (step 42) and decoded using the ECC decoder (step 44). If during the ECC decoding the number of error locations does not exceed a threshold at step 46 (e.g., not greater than t), then the data sector is decoded normally. However, if the number of error locations exceeds the threshold (step 46), then the ECC decoder is modified in order to increase the number of error locations detected (step 48). For example, if the ECC decoder implements a Reed-Solomon code, the Chien search for finding the roots of the error locator polynomial may be modified to search for up to 2 t error locations. The data sector is again decoded using the ECC decoder (step 50) except that the algorithm terminates after finding the error locations (the error values are not determined). After generating the data codewords CW0-CWn (step 52), the number of unrecoverable data codewords is determined (step 54) and the parity codewords are used to recover a single data codeword (step 56), two data codewords (step 58), three data codewords (step 60), or more depending on the number of parity codewords employed.

Any suitable control circuitry may be employed to implement the flow diagrams in the embodiments of the present invention, such as any suitable integrated circuit or circuits. For example, the control circuitry may be implemented within a read channel integrated circuit, or in a component separate from the read channel, such as a disk controller, or certain steps described above may be performed by a read channel and others by a disk controller. In one embodiment, the read channel and disk controller are implemented as separate integrated circuits, and in an alternative embodiment they are fabricated into a single integrated circuit or system on a chip (SOC). In addition, the control circuitry may include a suitable preamp circuit implemented as a separate integrated circuit, integrated into the read channel or disk controller circuit, or integrated into an SOC.

In one embodiment, the control circuitry comprises a microprocessor executing instructions, the instructions being operable to cause the microprocessor to perform the steps of the flow diagrams described herein. The instructions may be stored in any computer-readable medium. In one embodiment, they may be stored on a non-volatile semiconductor memory external to the microprocessor, or integrated with the microprocessor in a SOC. In another embodiment, the instructions are stored on the disk and read into a volatile semiconductor memory when the disk drive is powered on. In yet another embodiment, the control circuitry comprises suitable logic circuitry, such as state machine circuitry.

What is claimed is:

1. A disk drive comprising:
   a disk comprising a plurality of tracks, wherein each track comprises a plurality of data sectors including a parity sector, the parity sector comprising at least a P0 parity codeword and a P1 parity codeword;
   a head actuated over the disk; and
   control circuitry operable to:
   read a plurality of the data sectors to generate a plurality of data codewords CW0-CWn;
   read the parity sector;
   decode the data sectors using an error correction code (ECC) decoder;
   when a single data codeword in the CW0-CWn is unrecoverable using the ECC decoder, recover the single data codeword using the P0 parity codeword; and
   when two data codewords in the CW0-CWn are unrecoverable using the ECC decoder, recover the two data codewords using the P0 and P1 parity codewords;
   wherein:
   the P0 parity codeword is generated according to:

$P0 = CW0 \oplus CW1 \oplus \ldots CWn$; and the P1 parity codeword is generated according to:

$P1 = \alpha^0 \text{\textcircled{x}} CW0 \oplus \alpha^1 \text{\textcircled{x}} CW1 \oplus \ldots \alpha^n \text{\textcircled{x}} CWn$.

2. The disk drive as recited in claim 1, wherein each data sector comprises a plurality of interleaved ECC codewords, and the control circuitry is further operable to:
   de-interleave the interleaved ECC codewords in each data sector; and
   de-interleave the parity sector into the P0 and P1 parity codewords.

3. The disk drive as recited in claim 2, wherein each data sector comprises two interleaved ECC codewords.

4. The disk drive as recited in claim 2, wherein each data sector comprises more than two interleaved ECC codewords.

5. The disk drive as recited in claim 2, wherein the two data codewords are in the same interleave.

6. The disk drive as recited in claim 1, wherein the parity sector further comprises a P2 parity codeword generated according to:

$P2 = \alpha^{2 \cdot 0} \text{\textcircled{x}} CW0 \oplus \alpha^{2 \cdot 1} \text{\textcircled{x}} CW1 \oplus \ldots \alpha^{2 \cdot n} \text{\textcircled{x}} CWn$.

7. The disk drive as recited in claim 6, wherein when three data codewords in the CW0-CWN are unrecoverable using the ECC decoder, the control circuitry is further operable to recover the three data codewords using the P0, P1, and P2 parity codewords.

8. The disk drive as recited in claim 1, wherein the control circuitry is further operable to:
   use the ECC decoder to identify a number of error locations in a first data sector; and
   when the first data sector is unrecoverable using the ECC decoder, modify the ECC decoder to increase the number of error locations identified in the first data sector.

9. A disk drive comprising:
   a disk comprising a plurality of tracks, wherein each track comprises a plurality of data sectors including a parity sector, the parity sector comprising at least a P0 parity codeword, a P1 parity codeword, and a P2 parity codeword;
   a head actuated over the disk; and
   control circuitry operable to:
   read a plurality of the data sectors to generate a plurality of data codewords CW0-CWn;
   read the parity sector;
   decode the data sectors using an error correction code (ECC) decoder;
   when a single data codeword in the CW0-CWn is unrecoverable using the ECC decoder, recover the single data codeword using the P0 parity codeword;
   when two data codewords in the CW0-CWn are unrecoverable using the ECC decoder, recover the two data codewords using the P0 and P1 parity codewords; and
   when three data codewords in the CW0-CWn are unrecoverable using the ECC decoder, recover the three data codewords using the P0, P1 and P2 parity codewords;
   wherein:
   the P0 parity codeword is generated according to:

$P0 = CW0 \oplus CW1 \oplus \ldots CWn$;

the P1 parity codeword is generated according to:

$P1 = \alpha^0 \text{\textcircled{x}} CW0 \oplus \alpha^1 \text{\textcircled{x}} CW1 \oplus \ldots \alpha^n \text{\textcircled{x}} CWn$; and the P2 parity codeword is generated according to:

$P2 = \alpha^{2 \cdot 0} \text{\textcircled{x}} CW0 \oplus \alpha^{2 \cdot 1} \text{\textcircled{x}} CW1 \oplus \ldots \alpha^{2 \cdot n} \text{\textcircled{x}} CWn$.

10. A method of operating a disk drive, the disk drive comprising
    a disk and a head actuated over the disk, wherein:
    the disk comprises a plurality of tracks;
    each track comprises a plurality of data sectors including a parity sector; and the parity sector comprising at least a P0 parity codeword and a P1 parity codeword;
the method comprising:
reading a plurality of the data sectors to generate a plurality of data codewords CW0-CWn;
reading the parity sector;
decoding the data sectors using an error correction code (ECC) decoder;
when a single data codeword in the CW0-CWn is unrecoverable using the ECC decoder, recovering the single data codeword using the P0 parity codeword; and
when two data codewords in the CW0-CWn are unrecoverable using the ECC decoder, recovering the two data codewords using the P0 and P1 parity codewords;
wherein:
the P0 parity codeword is generated according to:

$$P0 = CW0 \oplus CW1 \oplus \ldots CWn; \text{ and}$$

the P1 parity codeword is generated according to:

$$P1 = \alpha^0 \otimes CW0 \oplus \alpha^1 \otimes CW1 \oplus \ldots \alpha^n \otimes CWn.$$

11. The method as recited in claim 10, wherein each data sector comprises a plurality of interleaved ECC codewords, further comprising:
de-interleaving the interleaved ECC codewords in each data sector; and
de-interleaving the parity sector into the P0 and P1 parity codewords.

12. The method as recited in claim 11, wherein each data sector comprises two interleaved ECC codewords.

13. The method as recited in claim 11, wherein each data sector comprises more than two interleaved ECC codewords.

14. The method as recited in claim 11, wherein the two data codewords are in the same interleave.

15. The method as recited in claim 10, wherein the parity sector further comprises a P2 parity codeword generated according to:

$$P2 = \alpha^{2 \cdot 0} \otimes CW0 \oplus \alpha^{2 \cdot 1} \otimes CW1 \oplus \ldots \alpha^{2 \cdot n} \otimes CWn.$$

16. The method as recited in claim 15, wherein when three data codewords in the CW0-CWN are unrecoverable using the ECC decoder, further comprising recovering the three data codewords using the P0, P1, and P2 parity codewords.

17. The method as recited in claim 10, further comprising:
using the ECC decoder to identify a number of error locations in a first data sector; and
when the first data sector is unrecoverable using the ECC decoder, modifying the ECC decoder to increase the number of error locations identified in the first data sector.

18. A method of operating a disk drive, the disk drive comprising
a disk and a head actuated over the disk, wherein:
the disk comprises a plurality of tracks;
each track comprises a plurality of data sectors including a parity sector; and
the parity sector comprising at least a P0 parity codeword, a P1 parity codeword, and a P2 parity codeword;
the method comprising:
reading a plurality of the data sectors to generate a plurality of data codewords CW0-CWn;
reading the parity sector;
decoding the data sectors using an error correction code (ECC) decoder; and
decoder, recovering the unrecoverable data codewords using the parity
when a single data codeword in the CW0-CWn is unrecoverable using the ECC decoder, recovering the single data codeword using the P0 parity codeword;
when two data codewords in the CW0-CWn are unrecoverable using the ECC decoder, recovering the two data codewords using the P0 and P1 parity codewords; and
when three data codewords in the CW0-CWn are unrecoverable using the ECC decoder, recovering the three data codewords using the P0, P1 and P2 parity codewords;
wherein:
the P0 parity codeword is generated according to:

$$P0 = CW0 \oplus CW1 \oplus \ldots CWn;$$

the P1 parity codeword is generated according to:

$$P1 = \alpha^0 \otimes CW0 \oplus \alpha^1 \oplus CW1 \oplus \ldots \alpha^n \otimes CWn; \text{ and}$$

the P2 parity codeword is generated according to:

$$P2 = \alpha^0 \otimes CW0 \oplus \alpha^{2 \cdot 1} \otimes CW1 \oplus \ldots \alpha^{2 \cdot n} \otimes CWn.$$

* * * * *